United States Patent [19]

Nozawa et al.

[11] Patent Number: 5,290,381
[45] Date of Patent: Mar. 1, 1994

[54] PLASMA ETCHING APPARATUS

[75] Inventors: Toshihisa Nozawa, Kobe; Junichi Arami, Tokyo; Keiji Horioka, Kawasaki; Isahiro Hasegawa, Zushi, all of Japan

[73] Assignees: Tokyo Electron Limited, Tokyo; Kabushiki Kaisha Toshiba, Kawasaki, both of Japan

[21] Appl. No.: 799,056

[22] Filed: Nov. 27, 1991

[30] Foreign Application Priority Data

Nov. 28, 1990 [JP] Japan .................................. 2-331317

[51] Int. Cl.$^5$ ............................................ H01L 21/00
[52] U.S. Cl. ...................... 156/345; 118/715; 118/725; 118/723 R; 204/298.33; 204/298.07; 204/298.08
[58] Field of Search ............... 156/345; 118/715, 723, 118/725; 204/298.33, 298.07, 298.08

[56] References Cited

U.S. PATENT DOCUMENTS

| | | | |
|---|---|---|---|
| 4,508,161 | 4/1985 | Holden | 118/724 |
| 4,565,601 | 1/1986 | Kakehi et al. | 156/643 |
| 4,609,037 | 9/1986 | Wheeler et al. | 165/61 |
| 4,771,730 | 9/1988 | Tezuka | 156/345 |
| 4,931,135 | 6/1990 | Horiuchi et al. | 156/345 |
| 5,078,851 | 1/1992 | Nishihata et al. | 156/345 |

FOREIGN PATENT DOCUMENTS

| | | |
|---|---|---|
| 0339580 | 11/1989 | European Pat. Off. |
| 63-141317 | 6/1988 | Japan |
| 63-227021 | 9/1988 | Japan |
| 63-229716 | 9/1988 | Japan |

OTHER PUBLICATIONS

Database WPIL, Derwent Publications Ltd., AN 89-359386, & JP-A-1 268 030, & U.S. Pat. No. 5,085,750, "Plasma Etching System for Semiconductor Device Mfr.-Has Gas Plasma Generator Sample Platform for Dividing Sample in Coolant Using Gas Laser".

Primary Examiner—Brian E. Hearn
Assistant Examiner—George Goudreau
Attorney, Agent, or Firm—Oblon, Spivak, McClelland, Maier & Neustadt

[57] ABSTRACT

A plasma etching apparatus comprising a susceptor for holding a semiconductive wafer, a cooling jacket having a coolant of a large cooling capacity and capable of quickly cooling said susceptor to an intended low temperature, a process chamber enclosing the susceptor and the cooling jacket, a gas discharging mechanism for evacuating the process chamber, an insulating member interposed between the susceptor and the cooling jacket, a gas supply device for supplying gas to an O-ring holding groove arranged on the interface regions of the susceptor, the insulating member and the cooling section and a pressure control mechanism for controlling the pressure of the supplied gas.

16 Claims, 5 Drawing Sheets

PLASMA ETCHING APPARATUS

BACKGROUND OF THE INVENTION

1. Field of the Invention

This invention relates to a plasma etching apparatus for performing an etching process on semiconductor wafers in high temperature plasma and, more particularly, it relates to a cooling mechanism for protecting semiconductor wafers from being damaged by heat during an etching process.

2. Description of the Related Art

In a dry etching process such as plasma etching, semiconductor wafer tend to be damaged as they are overheated by radiant heat of plasma. In a magnetron plasma etching apparatus, for instance, the accuracy of etching can become significantly low as the photo-resist on a wafer is damaged by heat. Particularly when wafers are anisotropically etched, the side walls of the etching portion that are etched can lose steepness to come to show a gentle slope and adversely affect the anisotropy produced by etching.

When the damage by heat is remarkable, the mask being used for etching can be totally lost before the intended etching process is over. A solution to avoid this problem may be the use of a thick resist layer. However, a thick resist layer causes a decrease in the accuracy of printing the mask pattern to the wafer.

A photoresist can sometimes be carbonized by radiant heat of high temperature plasma in an etching process. When such is the case, the carbonized photoresist is hard to remove from the wafer. In view of this problem, the temperature of wafers in plasma should be kept as low as possible.

In conventional plasma etching apparatus, each susceptor is cooled by a lower cooling jacket in order to indirectly cool wafers and avoid damage to wafers by radiant heat.

Currently, wafers are cooled in a range of from −60 to −100° C., further more the cooling temperature will be lowered to below −150° C. with the technological development at hand. The most ideal coolant to be used for cooling wafers to this low temperature will be liquid nitrogen in view of heat transfer loss at various sections and members of the cooling system.

The optimum temperature for cooling wafers is dependent on the conditions where the etching process is conducted. In conventional, systems overcooled wafers are heated by a temperature control device, so that the wafer is controlled to obtain various predetermined cooling temperatures.

However, since the cooling capacity of a cooling jacket using liquid nitrogen is normally made very large, the temperature of wafers cannot necessarily be properly controlled to quickly come to an intended level particularly when the temperature control device has a small heating capacity. A temperature control device comprising a large capacity heater, on the other hand, increases high electric energy consumption and running cost.

SUMMARY OF THE INVENTION

In view of the above problems, it is therefore the object of the present invention to provide a plasma etching apparatus that can accurately control the temperature of wafers to any intended level when they are quickly cooled to a low or very low temperature range without consuming a large amount of electric energy.

According to an aspect of the invention, a plasma etching apparatus comprises a susceptor for holding an object to be etched, a cooling section having a coolant of a large cooling capacity and capable of quickly cooling said the susceptor to an intended low temperature, a process chamber enclosing the susceptor and the cooling section, means for exhausting a gas in the process chamber, intermediate member interposed between the susceptor and the cooling section, gas supply means for supplying a heat transfer gas at least one of the interface region between the intermediate member and the susceptor, the interface region between the interposed member and the cooling section, and the interface region between each other components of the susceptor, and pressure control means for controlling the pressure of the heat transfer gas supplied by the gas supplying means.

The heat conductivity of the interface region between any two members is highly dependent on the contact condition, or the coarseness or smoothness of the surfaces of the members that contact with each other. Since the inside of the process chamber of a plasma etching apparatus is kept to low pressure, the heat conductivity between any two members there will be greatly reduced (to raise the thermal conductance R) if only a slight gap is existent between them because they are thermally insulated from each other by vacuum.

When the pressure of the heat transfer gas supplied to any of the interface regions, which is normally heat transfer gas, is lowered, the thermal resistance R there will be raised. If, conversely, the gas pressure is raised, the thermal resistance R is lowered.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Now, the present invention will be described in greater detail by referring to the accompanying drawings that illustrate preferred embodiments of the invention.

Figure 1:
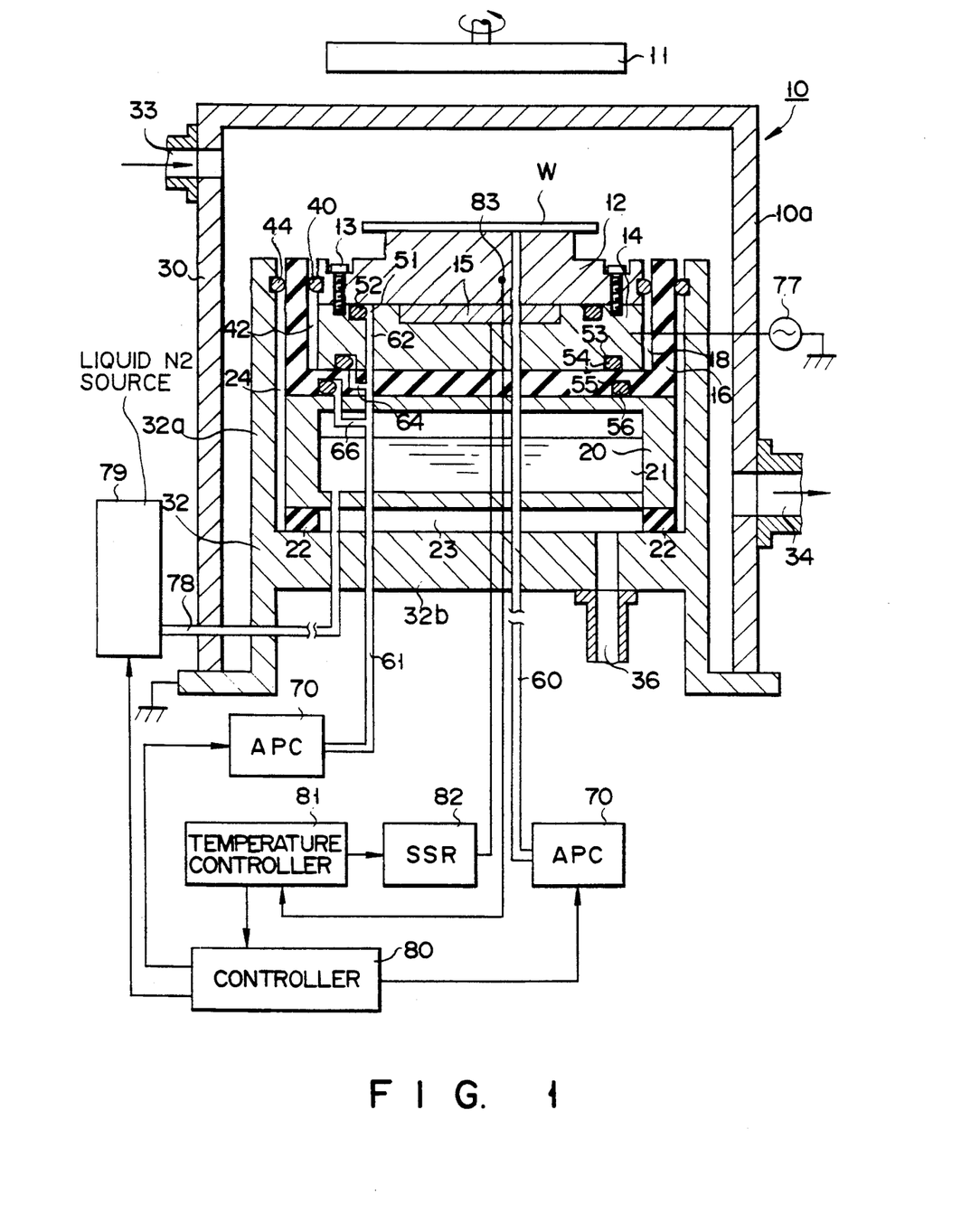
FIG. 1 is a block diagram of a first embodiment of the invention, showing the principal area in vertical cross section.

Referring firstly to FIG. 1 that illustrates a first embodiment of the invention, the wafer loading and unloading ports (not shown) of the magnetron plasma etching apparatus 10 communicate with respective load lock chambers (not shown) via respective pathways (not shown). Each of the pathways is provided with a gate mechanism (not shown) that opens or closes the pathway. Each of the load lock chambers (not shown) is provided in the inside with a wafer handler so that a silicon wafer W is picked up by the handler one by one at a time and carried into or out of the process chamber 10a of the apparatus 10.

As shown is in FIG. 1, the process chamber 10a contains a RIE-type etching apparatus. The process chamber 10a is formed by assembling an upper frame 30 and a lower frame 32. The housing constituted by the upper and lower frames 30, 32 is grounded.

A pathway 33 passes through an upper area of a side wall of the upper frame 30 and process gas is fed into the chamber 10a from a process gas source (not shown) by way of this pathway 33. Another pathway 34 runs through a lower area of another side wall of the upper frame 30 and gas in the chamber 10a is discharged through this pathway 34 by a suction pump (not shown).

A magnetic field generator 11 is arranged right above the process chamber 10a so that a horizontal magnetic field may be applied to the wafer W within the chamber 10a by the magnetic field generator 11.

As shown in FIG. 1, a heater 15 is inserted between the upper susceptor 12 and the lower susceptor 14 to finely control the temperature of the silicon wafer W.

The upper and lower susceptors 12, 14 are electrically insulated from the surrounding components by an insulation frame 16. The lower surface of the lower susceptor 14 is contacted with the upper surface of the insulation frame 16. The insulation frame 16 is placed directly on a cooling jacket 20 in such a manner that the lower surface of the insulation frame 16 is contacted with the upper surface of the cooling jacket 20.

The silicon wafer W is loaded on the top of the upper susceptor 12 and rigidly held there. An electrostatic chuck device that utilizes Coulomb's force may be used to firmly hold the silicon wafer W onto the upper susceptor 12. The upper susceptor 12 is removably held to the lower suspector 14 by using some bolts 13. The reason why the susceptor unit is constituted by a pair of separable susceptors 12, 14 is that, with such an arrangement, the lower susceptor 14 which is connected to a RF power source 77 remains free from maintenance and only the upper susceptor 12 may need replacement from time to time when it is contaminated.

A ceramic heater 15 is embedded between the upper and lower susceptors 12, 14. The heater 15 is connected to a temperature controller 81 by way of an electric current regulator (SSR) 82. The interface region of the heater 15 and the upper susceptor 12 is surrounded by an O-ring holding groove 51.

The side wall of the upper susceptor 12 and the side wall and the bottom of the lower susceptor 14 are completely covered by the insulation frame 16 so that only the top surface of the upper susceptor 12 is exposed to the process atmosphere. An O-ring 40 is inserted between the upper susceptor 12 and the insulation frame 16 in such a manner that a first gap 42 is provided between them. The surfaces of the peripheral walls of the upper and lower susceptors 12, 14 as well as the inner surface of the peripheral wall of the insulation frame 16 are mirror polished. The first gap 42 is nearly devoid of gas.

The cooling jacket 20 is arranged right below the insulation frame 16 and contains liquid nitrogen in its container section 21. A liquid nitrogen source 79 that operates as a heat exchanger is arranged in communication with the cooling jacket 20 via a pipe 78, which communicates at the bottom portion of the cooling jacket 20. The output section of the main controller 90 is connected to the flow rate control valve (not shown) of the liquid nitrogen source 79 so that valve setting signals are supplied from the main controller 90 to the flow rate control valve.

The inner wall of the bottom of the cooling jacket 20 is made porous so that nucleate boiling may take place at the bottom to keep to −196° C. the temperature of the liquid nitrogen in the cooling jacket 20. A vacuum insulated pipe (not shown; trademark "Violet") is connected to the cooling jacket 20 to feed the container section 21 with liquid nitrogen. The vacuum insulated pipe is made of metal and grounded. The upper frame 30 is also grounded and a pair of electrodes having opposite polarities are formed between the susceptors 12, 14 and the upper frame 30 when power is supplied from the RF power source 77 to the functional susceptor (lower susceptor) 14.

A plurality of insulator members 22 are inserted between the cooling jacket 20 and the bottom 32b of the lower frame 32 to produce a second gap 23 between them. On the other hand, an inner cylinder 32a extends upward from the bottom 32b of the lower frame 32 to enclose the cooling jacket 20 and the insulation frame 16 and protect them against exposure to the process atmosphere.

An O-ring 44 is inserted between the insulation frame 16 and the inner cylinder 32a to produce a third gap 24. The outer surface of the peripheral wall of the insulation frame 16 and the inner surface of the inner cylinder 32a are mirror polished. The O-rings 40, 44 are made of a fluororesin material such as teflon.

The plurality of insulator members 22 for supporting the cooling jacket 20 are mutually spaced apart. Therefore, the second gap 23 and the third gap 24 are communicated with each other. The third gap 24 is preferably made as narrow as possible so long as the insulation frame 16 and the cooling jacket 20 do not touch the inner cylinder 32a.

A gas discharge pathway 36 runs through the bottom 32 of the lower frame 32 so that the second and third gaps 23, 24 can be evacuated by means of this gas discharge pathway 36.

An O-ring 52 is inserted between the upper and lower susceptors 12, 14. The O-ring 52 is held in a groove 51 formed on the upper surface of the lower susceptor 14 and surrounds the heater 15. Another O-ring 54 is inserted between the lower susceptor 14 and the insulation frame 16. The O-ring 54 is held in a groove 53 formed on the lower surface of the lower susceptor 14. Still another O-ring 56 is inserted between the insulation frame 16 and the cooling jacket 20. The O-ring 56 is held in a groove 55 arranged on the lower surface of the insulation frame 16. The O-rings 52, 54, 56 are made of a fluororesin material such as teflon.

The etching gas in the process chamber 10a is discharged by way of the discharge pathway 34 until the gas pressure in the chamber 10a becomes as low as somewhere between $10^{-2}$ and $10^{-3}$ Torr. Then, gas plasma is produced from the etching gas between the electrodes having opposite polarities as described earlier. In the magnetron plasma etching apparatus, electrons show a cycloidal movement to increase the number of times at which they hit molecules to give rise to ionization because of the interaction between the magnetic field and the electric field of the plasma sheath that orthogonally intersects the magnetic field. Thus, it can produce a high speed etching under such low pressure as mentioned above.

Now, the mechanism for controlling the temperature at the interface regions among the components W, 12, 14, 16 and 20 will be described below.

The heat conductivity between two members with each other is highly dependent on the condition of the contact surfaces, or the coarseness or smoothness of each surface of the members that contact each other. Since the inside of the process chamber of a plasma etching apparatus is kept to low pressure, the heat conductivity between any two members there will be greatly reduced if only a slight gap is existent between them because they are thermally insulated from each other by a vacuum.

Figure 2:
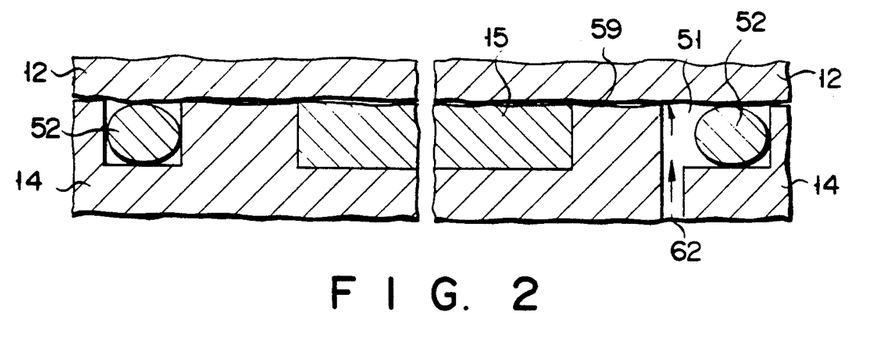
FIG. 2 is an enlarged partial sectional view of an interface region between a susceptor and an adjacent component, showing a minute gap between them and a gas supply path.

As shown in FIG. 2, there is a microscopic gap 59 along the interface of the upper and lower susceptors 12, 14. Even with such a minute gap 59, the two members 12, 14 are thermally, though partly, the interface region is occurred an evacuated insulation by vacuum and the overall thermal resistance R between them will be significantly reduced.

In this embodiment, in order to offset the reduced thermal resistance R, gas is introduced into the minute gap 59 from an automatic pressure controller 70 by way of a branch pathway 62 and the O-ring holding groove 51, the branch pathway 62 communicating at the inner side of the groove 51. While the heat transfer gas used there is helium gas, any gas may be used in place of helium so long as it has a good thermal conductivity and does not chemically attack the components of the apparatus. Candidate gases include argon gas, xenon gas, nitrogen gas and carbon dioxide gas. The pressure of the supplied helium gas is controlled by automatic pressure controllers 70 so that the reading of the pressure gage is always found between 0 to 760 Torr.

In a series of experiments to look into the relationship between the gas pressure and the thermal resistance, it was found that the thermal resistance changes linearly with the gas pressure between 0 and 300 Torr.

Helium gas is also supplied to the other O-ring holding grooves 53 and 55 from the corresponding APCs 70 by way of respective branch pathways 64 and 66.

Besides, helium gas is also supplied from the corresponding APC 70 to the gap between the wafer W and the upper surface (wafer chuck top) of the upper susceptor 12 by way of branch gas pathway 60.

The upper and lower surfaces of the metal components 12, 14 and 20 are finished to a smoothness of 0.01 mm and an average coarseness of less than 3.2 $\mu$m. The upper and lower surfaces of the insulating members 16 and 22 are also finished to a smoothness of 0.01 mm and an average coarseness of less than 3.2 $\mu$m.

The upper and lower susceptors 12, 14 and the cooling jacket 20 as well as the lower frame 32 are made of aluminum alloy. The insulating members 16 and 22 are made of an alumina system ceramic containing $Al_2O_3$ and/or AlN or a Si system ceramic containing $Si_3N_4$ and/or SiC.

A temperature sensor 83 is buried in the upper susceptor 12 and signals representing the temperature sensed by the sensor 83 are given to a temperature controller 81. The output terminal of the temperature controller 81 is connected to the electric current regulator (SSR) 82. The SSR 82 is connected to the heater 15 to control the supply of electricity to the heater 15. The output terminal of the temperature controller 81 is connected to the input terminal of the main controller 80. The temperature controller 81 operates as a subsidiary controller that assists the main controller 80.

Figure 3:
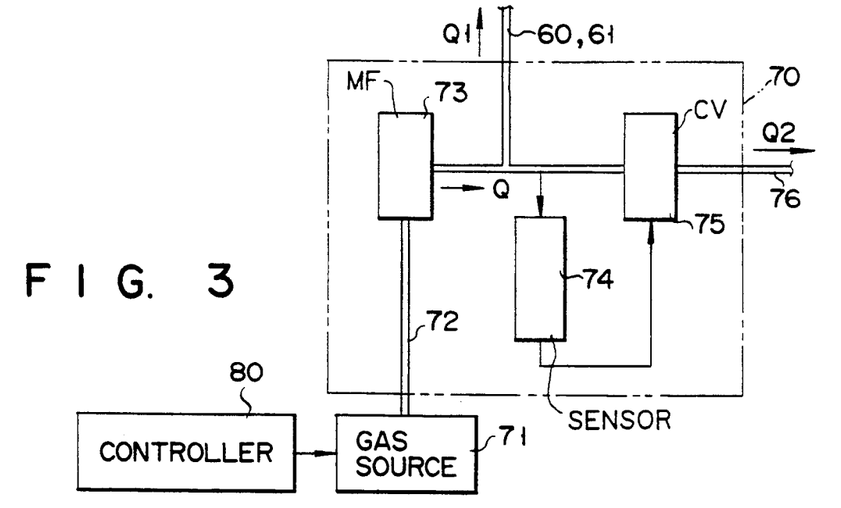
FIG. 3 is a block diagram showing the configuration of the automatic pressure control (APC)

The APC 70 will be described in detail by referring to FIG. 3.

The inlet 72 of each of the APCs 70 communicates with a gas supply source 71 and the power switch of this gas supply source 71 is connected to the output section of the main controller 80. A mass flow meter 73 is arranged at the inlet 72 to measure the flow rate of gas coming from the gas supply source 71. The outlet of each of the APOs 70 is branched into main pathways 60, 61 and a subsidiary pathway 76. Each of the main outlet pathways 60, 61 communicates with the upper surface of the upper susceptor 12 (wafer chuck top) and the O-ring holding grooves 51, 52, 55.

The subsidiary outlet pathway 76 is, on the other hand, provided with a control valve 75 and a pressure sensor 74 is arranged between the mass flow meter 73 and the control valve 75 to actuate the control valve 7 depending on the pressure detected by the sensor 74. Therefore, the incoming gas with a flow rate Q may partly flow out from the apparatus with a flow rate Q1 by way of the subsidiary outlet pathway 76 to keep the gas flow rate Q2 through the main pathways 60, 61 to an appropriate level.

A wafer is cooled to a given process temperature and etched in the embodiment in a manner as described below.

In a RIE-type plasma etching apparatus as this embodiment, the upper and lower frames 30, 32 are grounded and RF power is supplied to the upper and lower susceptors 12, 14 to produce electrically opposite polarities there. A horizontal magnetic field is generated around the wafer W in parallel with the latter by rotating the permanent magnet of the apparatus 11 located above the chamber 10a. After evacuating the chamber 10a, process gas is introduced into it to generate plasma. Since a horizontal magnetic field is produced around the wafer W, flying ions are directed perpendicular to the surface of the wafer W to carry out a highly anisotropic etching process.

Before and during the etching process, the susceptors and the surrounding area are cooled by the cooling jacket 20 and the temperature of the wafer W is controlled to keep a preset process temperature level. The liquid nitrogen 21 (−196° C.) in the cooling jacket 20 will show an excessive cooling effect with regard to the preset process temperature (−156° C.). In order to offset this excessive cooling effect affecting the jacket 20 and the wafer W, the upper and lower susceptors 12, 14 are heated by the heater 15. The excessive cooling effect to the jacket 20 and the wafer W may be also mollified by appropriately regulating the pressure of helium gas supplied to the grooves 51, 53, 55 and the wafer chuck top to increase the thermal resistance at the respective interface regions.

Figure 4:
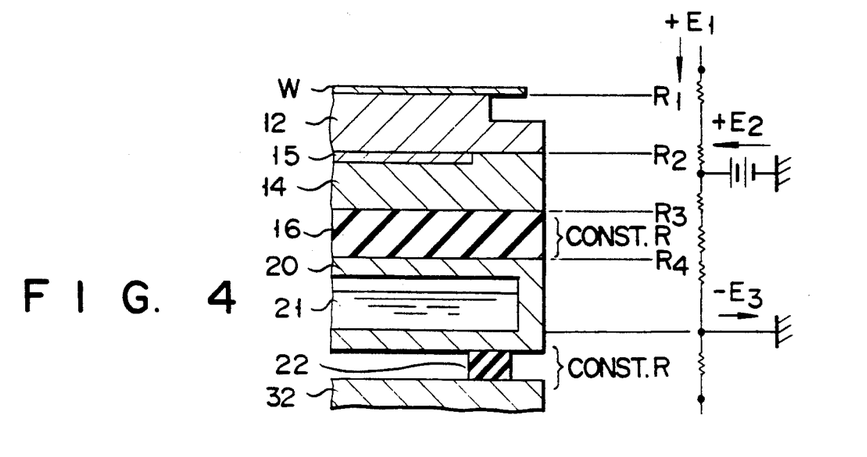
FIG. 4 is a diagram illustrating the concept of thermal resistance by juxtaposing a partial sectional view of a wafer and the susceptor and a circuit diagram of the resistors.

The thermal resistance around the susceptors of the embodiment is controlled in a manner as described below by referring to FIG. 4.

During an etching process, the wafer W receives radiant heat energy E1 from the plasma, which has energy E1 made to flow into the cooling jacket 20 by way of the members 12, 14 and 16. As the lower surface of the cooling jacket 20 is thermally insulated from the member 32 by a vacuum, thermal energy does not practically run from the cooling jacket 20 toward the member 32. This is because the lower surface of the cooling jacket 20 shows a very large thermal resistance as it contacts only partly with a few number of insulating members 22. Consequently, thermal energy E3 will run into the liquid nitrogen 32 in the cooling jacket 20 to cool down the wafer W.

Since the amount of outgoing energy E3 is greater than the amount of incoming energy E1, the member 12 will be heated by the heater 15 to show a net input energy input E2.

When the heat supplied to the wafer W by the heater is not sufficient for the wafer W to be heated, the amount of outgoing energy E3 may be reduced by increasing thermal resistance R1 through R4 of the system. The net input energy E2 and the outgoing energy E3 are controlled on the basis of the temperature detected by the sensor 83 so that the wafer W may be kept to a preset process temperature.

The thermal resistances R1 through R4 become high when the pressure of helium gas supplied to the interfaces is lowered. Conversely, the thermal resistances R1 through R4 can be lowered by increasing the pressure of helium gas fed to the interface regions.

The condition of mutual contact of the upper and lower susceptors 12, 14 can be modified by adjusting the fastening force of the bolts 13. The thermal resistance R2 there will be increased as the bolts 13 are tightened, whereas it will be decreased as the bolts 13 are loosened.

The effect of anisotropic etching on the wafer W can vary depending on the temperature involved. This will be explained below by referring to FIGS. 5 through 7. In the following description, the RF power is 900 W and the CHF$_3$ gas flow rate is 50 SCCM, while the internal pressure of the chamber is 40 m Torr.

Figure 5:
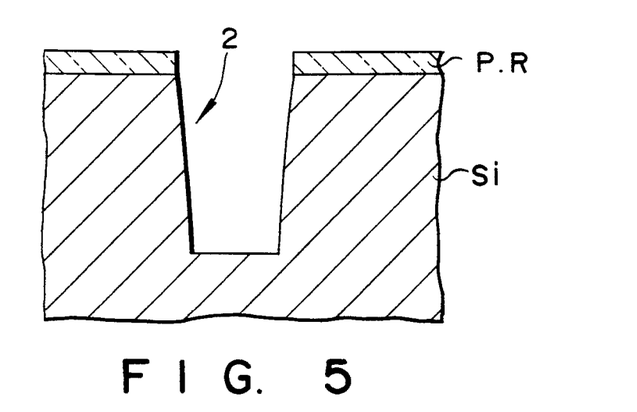
FIG. 5 is a schematic partial sectional view of a wafer anisotropically etched at −156° C.

FIG. 5 is a schematic partial sectional view of a wafer W etched at a process temperature of −156° C.

Figure 6:
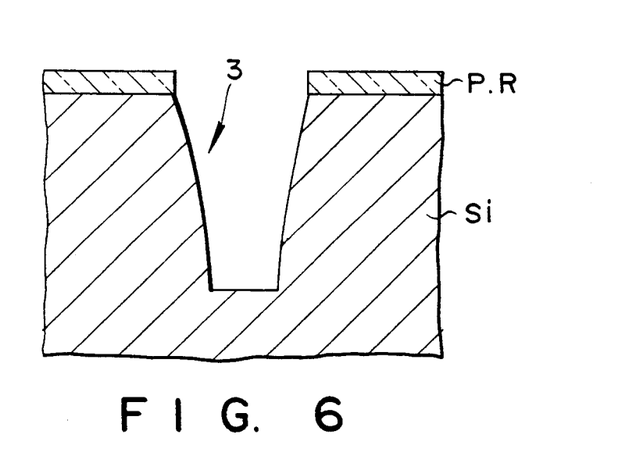
FIG. 6 is a schematic partial sectional view of a wafer anisotropically etched at −46° C.

FIG. 6 is a schematic partial sectional view of a wafer W etched at a process temperature of −46° C.

Figure 7:
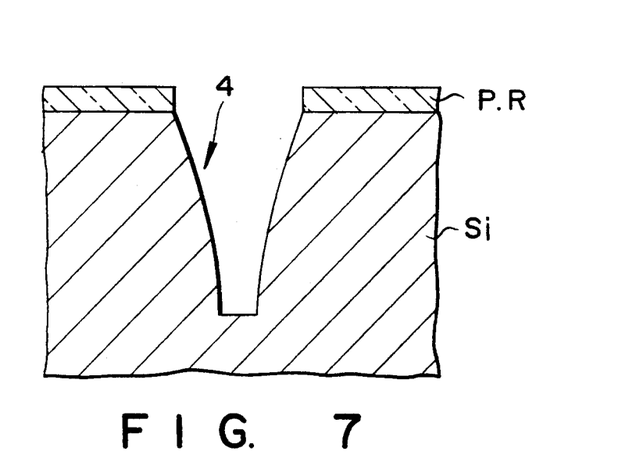
FIG. 7 is a schematic partial sectional view of a wafer anisotropically etched at −9° C.

FIG. 7 is a schematic partial sectional view of a wafer W etched at a process temperature of −9° C.

As seen from these pictures, the side walls 2, 3, 4 of the anisotropically etched wafer come closer to vertically as the temperature of the wafer W being etched goes down. Differently stated, the anisotropic effect of etching is intensified as the temperature of the wafer W is lowered. Semiconductor devices which are integrated to as high as 16M, 32M and 64M can be produced only by such highly anisotropic etching process.

In the above embodiment, the heat energy supply to the heater 15 is minimized to reduce the overall power consumption even when the process temperature for the wafer W is set to −156° C.

Since not only the pressure of the heat transfer gas fed to the interface region of the wafer W and the upper susceptor 12 but also the pressure of the heat transfer gas supplied to each of the other interface regions are controlled in this embodiment, the temperature of the wafer W can be finely controlled within a wide range between −9° C. and −156° C.

While liquid nitrogen was used as the cooling medium in the cooling jacket 20 in the above embodiment, it may be replaced by a different coolant such as liquid helium.

While helium gas is fed to the O-ring holding grooves in the above embodiment, routes of supplying helium gas are not necessarily restricted to them and the embodiment may be alternatively provided with specifically designed grooves into which helium gas is supplied.

Figure 8:
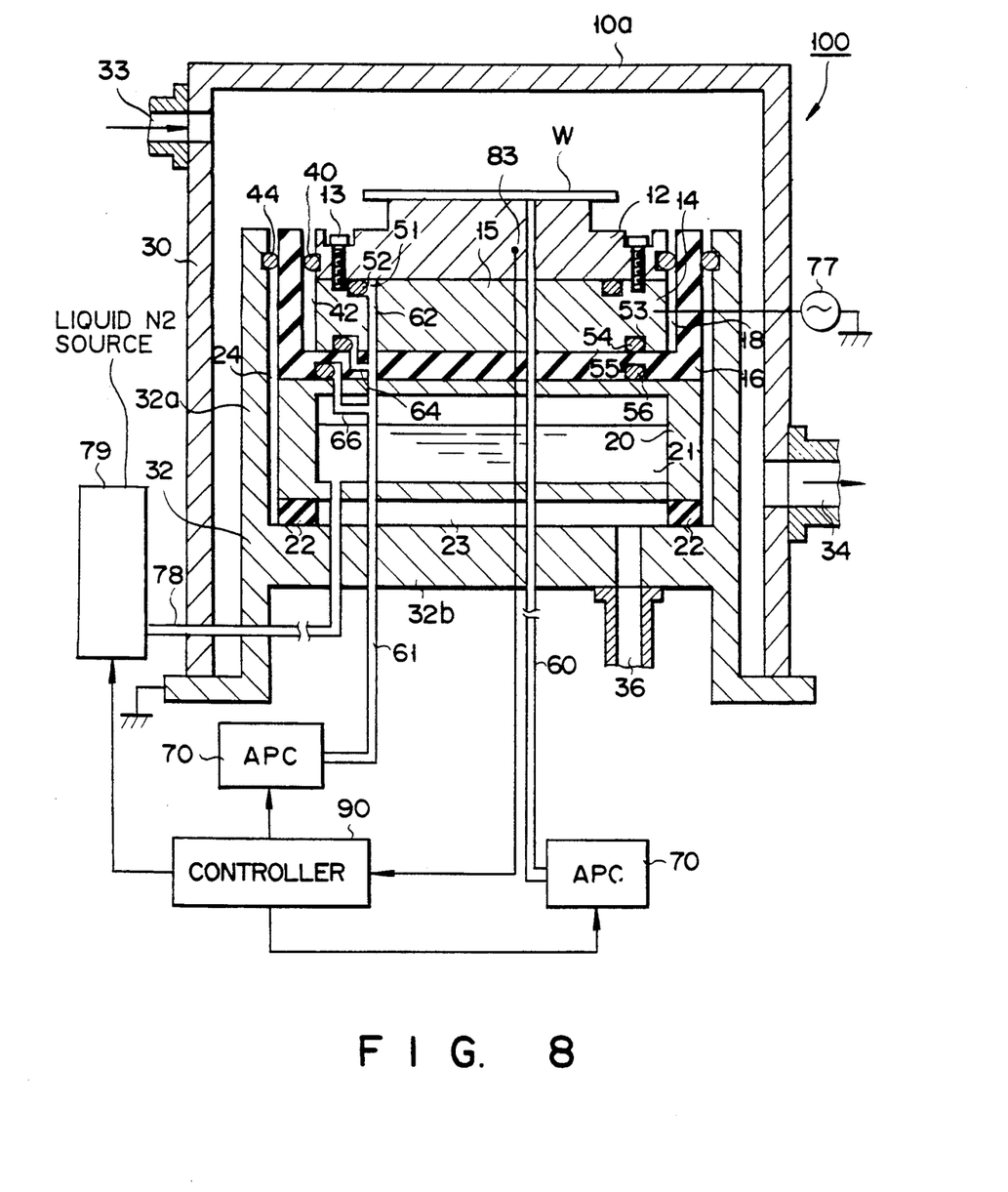
FIG. 8 is a block diagram of a second embodiment of the invention, showing the principal area in vertical cross section.

Now, a second embodiment of the invention will be described by referring to FIG. 8. Explanations of the parts of this embodiment that are similar to those of the first embodiment will be omitted.

In the etching apparatus 100 of this embodiment, signals representing the temperature detected by the temperature sensor 83 are directly sent to the main controller 90. No temperature control heater is provided there and the apparatus comprises only mechanisms for controlling the thermal resistances R1 through R4 of the interfaces.

The excessive cooling effect of liquid nitrogen on the wafer W can be satisfactorily neutralized only by such a thermal resistance controlling mechanism. The apparatus 100 satisfactorily operates particularly when the preset process temperature for the wafer W is as low as −156°, which is close to the liquefying temperature (−196° C.) of nitrogen.

Figure 9:
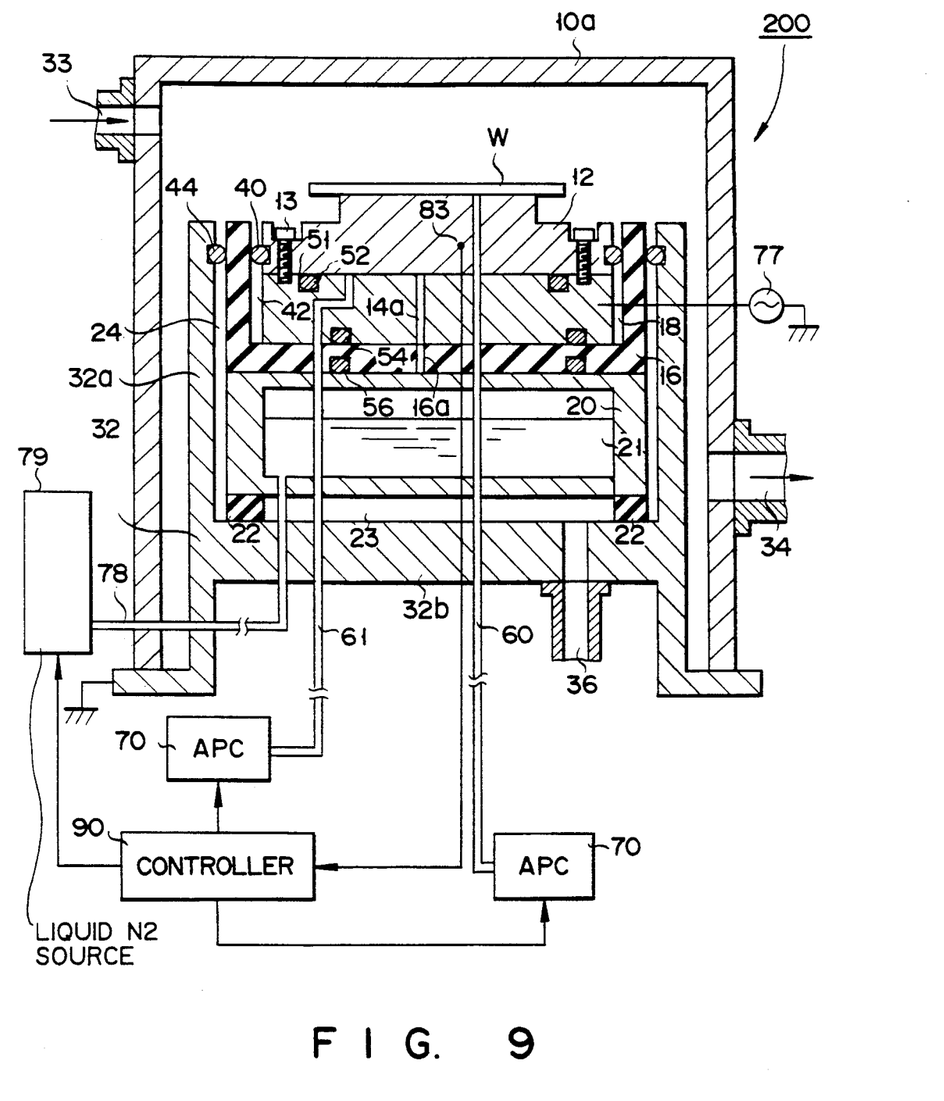
FIG. 9 is a block diagram of a third embodiment of the invention showing the principal area in vertical cross section.

A third embodiment of the invention will be described below by referring to FIG. 9. Explanations of the parts of this embodiment that are common with those of the first and second embodiments will be omitted.

No temperature control heater is provided in the etching apparatus 200 of this third embodiment and gas is introduced only to the O-ring holding groove 51 between the upper and lower susceptors 12, 14 by way of the pathway 61.

On the other hand, pathways 14a, 16a are formed through respectively with the susceptor 14 and the member 16 so that gas may be supplied to the inner regions of the O-rings 52, 54, 56. Signals representing the temperature detected by the temperature sensor 83 are directly sent to the main controller 90.

Thus, the apparatus has a relatively simple configuration and allows easy servicing process as it comprises only a small number of thermal resistance control mechanisms.

The condition of mutual contact of the upper and lower susceptors 12, 14 can be modified by regulating the fastening force of the bolts 13 to appropriately control the thermal resistance R2.

As is apparent from the above description, an apparatus according to the invention provides a wide range of preset process temperatures by using highly efficient cooling means. At the same time, different thermal resistances around the susceptors of the apparatus can be appropriately regulated by using heat transfer gas supplying mechanisms. With such arrangements, the wafer W being etched can be cooled to a very low temperature range to realize a high anisotropy for the wafer and consequently a highly integrated semiconductive device.

Moreover, the power supply to the temperature regulating heater can be minimized to reduce the overall energy consumption and hence the running cost of the apparatus even when a very low temperature is set for etching.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A plasma etching apparatus comprising:
   a susceptor for holding an object to be etched;
   a cooling section for cooling said susceptor;
   a process chamber enclosing the susceptor and the cooling section;
   exhausting means for exhausting a gas in the process chamber;
   gas supply means for supplying a heat transfer gas at a interface region between the susceptor and the cooling section;
   heating means for heating the susceptor; and
   temperature detecting means for detecting a temperature of the susceptor, to thereby control heating of said heating means based on the detected temperature.

2. A plasma etching apparatus according to claim 1, further comprising pressure control means for controlling the pressure to supply the heat transfer gas to the interface region, on the basis of a temperature detected by said temperature detecting means.

3. A plasma etching apparatus according to claim 1, whereby the pressure of the heat transfer gas supplied to an interface region between said heating means and the susceptor is controlled by said pressure control means.

4. A plasma etching apparatus according to claim 1, wherein a gas supply region is isolated and sealed against the atmosphere in the process chamber.

5. A plasma etching apparatus according to claim 1, wherein said heat transfer gas is inert gas.

6. A plasma etching apparatus according to claims 1, further comprising an insulation frame interposed between the susceptor and the cooling section.

7. A plasma etching apparatus according to claim 1, wherein the susceptor has an upper susceptor member and a lower susceptor member which are in a state of contact.

8. A plasma etching apparatus according to claim 7, further comprising means for adjusting the state of contact of the upper and lower susceptor members of the susceptor in the interface region.

9. A plasma etching apparatus according to claim 1, further comprising means for supplying gas to an interface region between the object and the susceptor, thereby controlling pressure of the heat transfer gas by said pressure control means.

10. A plasma etching apparatus according to claim 7, wherein the heat transfer gas is supplied to an interface region between the lower susceptor and the upper susceptor member, through an inner surface side of an O-ring holding groove formed in an upper surface of the lower susceptor.

11. A plasma etching apparatus according to claim 7, whereby the pressure of the heat transfer gas supplied to an interface region between the upper and lower susceptor members of the susceptor is controlled by said pressure control means.

12. A plasma etching apparatus according to claim 6, whereby the pressure of the heat transfer gas supplied to an interface region between the insulation frame and the cooling section is controlled by said pressure control means.

13. A plasma etching apparatus according to claim 6, wherein said insulation frame is made of material for electrically insulating said susceptor from said cooling section.

14. A plasma etching apparatus according to claim 6, wherein the heat transfer gas is supplied to the interface region between the insulation frame and the cooling section, and to that between the insulation frame and the susceptor, via an inner surface side of an O-ring holding groove.

15. A plasma etching apparatus according to claim 6, further comprising means for supplying gas to an interface region between the object and the susceptor, thereby controlling pressure of the heat transfer gas by said pressure control means.

16. A plasma etching apparatus according to claim 6, whereby the pressure of the heat transfer gas supplied to an interface region between the insulation frame and the susceptor is controlled by said pressure control means.

* * * * *